United States Patent
Liu et al.

(10) Patent No.: US 12,094,769 B2
(45) Date of Patent: Sep. 17, 2024

(54) METHODS FOR FILLING A GAP AND RELATED SYSTEMS AND DEVICES

(71) Applicant: ASM IP Holding B.V., Almere (NL)

(72) Inventors: Zecheng Liu, Sagamihara (JP); Viljami Pore, Helsinki (FI); Jia Li Yao, Tokyo (JP); René Henricus Jozef Vervuurt, Leuven (BE)

(73) Assignee: ASM IP Holding B.V., Almere (NL)

( * ) Notice: Subject to any disclaimer, the term of this patent is extended or adjusted under 35 U.S.C. 154(b) by 267 days.

(21) Appl. No.: 17/530,691

(22) Filed: Nov. 19, 2021

(65) Prior Publication Data

US 2022/0165615 A1 May 26, 2022

Related U.S. Application Data

(60) Provisional application No. 63/117,698, filed on Nov. 24, 2020.

(51) Int. Cl.
*H01L 21/02* (2006.01)
*H01J 37/32* (2006.01)
*H01L 21/3065* (2006.01)
*H01L 21/768* (2006.01)

(52) U.S. Cl.
CPC .... *H01L 21/76837* (2013.01); *H01J 37/3244* (2013.01); *H01L 21/02126* (2013.01); *H01L 21/3065* (2013.01); *H01L 21/76877* (2013.01)

(58) Field of Classification Search
CPC ......... H01L 21/76837; H01L 21/02126; H01L 21/3065; H01L 21/76877; H01L 21/02164; H01L 21/02211; H01L 21/02219; H01L 21/02222; H01L 21/02274; H01L 21/0228; H01L 21/76224; H01L 21/02315; H01L 21/0234; H01L 21/02208; H01J 37/3244; C23C 16/045; C23C 16/401; C23C 16/45542; C23C 16/45544; C23C 16/5096; C23C 16/04; C23C 16/402; C23C 16/4554; C23C 16/45553

See application file for complete search history.

(56) References Cited

U.S. PATENT DOCUMENTS

| | | | | |
|---|---|---|---|---|
| 2016/0293398 | A1* | 10/2016 | Danek | H01L 21/02211 |
| 2017/0117134 | A1* | 4/2017 | Henri | H01L 21/0228 |
| 2018/0350587 | A1* | 12/2018 | Jia | H01L 21/02205 |
| 2019/0035810 | A1* | 1/2019 | Chun | H01L 21/76883 |
| 2020/0017967 | A1* | 1/2020 | Abel | H01L 21/76224 |

OTHER PUBLICATIONS

Scientific and Technical Information Center EIC 2800 Search Report dated Feb. 16, 2012.

* cited by examiner

*Primary Examiner* — Katherine A Bareford
*Assistant Examiner* — Christina D McClure
(74) *Attorney, Agent, or Firm* — Snell & Wilmer L.L.P.

(57) ABSTRACT

Methods and related systems for filling a gap feature comprised in a substrate are disclosed. The methods comprise a step of providing a substrate comprising one or more gap features into a reaction chamber. The one or more gap features comprise an upper part comprising an upper surface and a lower part comprising a lower surface. The methods further comprise a step of subjecting the substrate to a first plasma treatment and subjecting the substrate to a second plasma treatment. Thus the upper surface is inhibited while leaving the lower surface substantially unaffected. Then, the methods comprise a step of selectively depositing a material on the lower surface.

18 Claims, 8 Drawing Sheets

METHODS FOR FILLING A GAP AND RELATED SYSTEMS AND DEVICES

CROSS-REFERENCE TO RELATED APPLICATIONS

This application claims priority to U.S. Provisional Patent Application Ser. No. 63/117,698 filed Nov. 24, 2020 titled METHODS FOR FILLING A GAP AND RELATED SYSTEMS AND DEVICES, the disclosure of which is hereby incorporated by reference in its entirety.

FIELD OF INVENTION

The present disclosure generally relates to methods and systems suitable for forming electronic devices. More particularly, the disclosure relates to methods and systems that can be used for depositing a material in gaps, trenches, and the like.

BACKGROUND OF THE DISCLOSURE

The scaling of semiconductor devices has led to significant improvements in speed and density of integrated circuits. However, with miniaturization of wiring pitch of large scale integration devices, void-free filling of high aspect ratio gaps or trenches (e.g. trenches having an aspect ratio of three or higher) becomes increasingly due to limitations of existing deposition processes. Therefore, there is a need for processes that efficiently fill high aspect ratio features, e.g. gaps such as trenches on semiconductor substrates.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

Various embodiments of the present disclosure relate to gap filling methods, to structures and devices formed using such methods, and to apparatus for performing the methods and/or for forming the structure and/or devices. The ways in which various embodiments of the present disclosure address drawbacks of prior methods and systems are discussed in more detail below.

Described herein is a method for filling a gap feature on a substrate surface. The method comprises, in the given order: a step of positioning a substrate on a substrate support in a reaction chamber, a step of subjecting the substrate to a first plasma treatment and subjecting the substrate to a second plasma treatment, and a step of selectively depositing a material on the lower surface. The substrate comprises one or more gap features. The one or more gap features comprise an upper part and a lower part. The upper part comprises an upper surface, and the lower part comprises a lower surface. The step of subjecting the substrate to a first plasma treatment and subjecting the substrate to a second plasma treatment results in an inhibition of the upper surface while leaving the lower surface substantially unaffected. Thus, the material can be selectively grown in the gap in a bottom-up fashion.

In some embodiments, the first plasma treatment comprises generating a nitrogen-containing plasma in the reaction chamber.

In some embodiments, the nitrogen-containing plasma is a $N_2$-containing plasma.

In some embodiments, the second plasma treatment comprises generating a noble gas-containing plasma in the reaction chamber.

In some embodiments, the noble gas-containing plasma is an argon-containing plasma.

In some embodiments, the substrate is maintained at a temperature of at least 100° C. to at most 550° C.

In some embodiments, selectively depositing a material on the lower surface comprises a cyclical process. The cyclical process comprises a plurality of sub cycles. A sub cycle comprises, in the given order: a step of exposing the substrate to a precursor, thereby forming chemisorbed precursor on the lower surface; and, a step of exposing the substrate to a third plasma treatment, thereby allowing one or more reactive species comprised in the plasma to react with the chemisorbed precursor on the lower surface.

In some embodiments, the method comprises executing a plurality of super cycles. A super cycle comprises the step of subjecting the substrate to a first plasma treatment and subjecting the substrate to a second plasma treatment; and, the step of selectively depositing a material on the lower surface.

In some embodiments, the third plasma treatment comprises generating an oxygen-containing plasma in the reaction chamber.

In some embodiments, the oxygen-containing plasma is an $O_2$-containing plasma.

In some embodiments, the precursor comprises a silicon precursor.

In some embodiments, the silicon precursor comprises an alkylaminosilane.

In some embodiments, the silicon precursor is selected from bisdiethylaminosilane and diisopropylaminosilane.

In some embodiments, selectively depositing a material on the lower surface comprises a cyclical process, the cyclical process comprising a plurality of sub cycles. A sub cycle comprises, in the following order: a step of exposing the substrate to an under-dosed halide-containing precursor, thereby forming a chemisorbed halide-containing precursor on the upper surface; a step of exposing the substrate to a second precursor, thereby forming a chemisorbed second precursor on the lower surface; a step of exposing the substrate to a nitrogen plasma comprising one or more reactive nitrogen species, thereby allowing the reactive nitrogen species to react with the chemisorbed halide-containing precursor to form a nitrogen and halogen containing etchant; and, a step of exposing the substrate to an oxygen plasma, thereby allowing one or more oxygen-containing reactive species comprised in the plasma to react with the chemisorbed precursor on the lower surface, thereby forming an oxide on the lower surface.

In some embodiments, the method further comprises executing a plurality of super cycles. A super cycle comprises, in the following order: the step of subjecting the substrate to a first plasma treatment and subjecting the substrate to a second plasma treatment; the step of step of exposing the substrate to an under-dosed halide-containing precursor; the step of exposing the substrate to a second precursor; the step of exposing the substrate to a nitrogen plasma; and, the step of exposing the substrate to an oxygen plasma.

In some embodiments, the halide-containing precursor is a halide-containing silicon precursor.

In some embodiments, the halide-containing silicon precursor comprises a halogenated alkoxysilane.

In some embodiments, the halide-containing silicon precursor is selected from Trimethoxy(3,3,3-trifluoropropyl) silane and nonafluorohexyl-trimethoxysilane.

In some embodiments, the second precursor is a second silicon precursor.

In some embodiments, the second silicon precursor comprises Si, C, H, and N.

In some embodiments, the second silicon precursor comprises an alkylaminosilane.

In some embodiments, the second silicon precursor is selected from bisdiethylaminosilane and diisopropylaminosilane.

In some embodiments, the second silicon precursor is selected from diisopropylaminotrisilylamine, diisopropylaminodisilane, dimethylaminopentamethyldisilane, and disec-butylaminodisilane.

In some embodiments, the second silicon precursor comprises an amino-substituted cyclosiloxane.

In some embodiments, the second silicon-precursor comprises an alkyl- and amino-substituted cyclosiloxane.

In some embodiments, the second silicon precursor comprises 2-diethylamino-2,4,6,8-tetramethylcyclotetrasiloxane.

In some embodiments, the material comprises silicon oxide, and wherein selectively depositing the silicon oxide on the lower surface comprises a cyclical process, the cyclical process comprising a plurality of sub cycles, a sub cycle comprising, in the given order: a step of exposing the substrate to a silicon precursor, thereby forming chemisorbed silicon precursor on the lower surface, wherein the silicon precursor comprises a compound selected from the list consisting of alkylsilyl-substituted linear or cyclic secondary amines, alkylsilazanes, and aminoalkyl-substituted alkoxysilanes; and, a step of exposing the substrate to an oxygen plasma, thereby allowing one or more reactive oxygen species comprised in the plasma to react with the chemisorbed precursor to form silicon oxide on the lower surface.

In some embodiments, the method comprises executing a plurality of super cycles, a super cycle comprising the step of subjecting the substrate to a first plasma treatment and subjecting the substrate to a second plasma treatment; and, the step of selectively depositing the silicon oxide on the lower surface.

In some embodiments, the silicon precursor comprises a compound selected from the list consisting of N-Methyl-aza-2,2,4-trimethylsilacyclopentane, Hexamethyldisilazane, (3-Aminopropyl) trimethoxysilane and 3-Methoxypropyltrimethoxysilane.

In some embodiments, the step of selectively depositing a material on the lower surface is done at a growth rate per cycle of at least 0.1 Å/cycle to at most 10 Å/cycle.

Further described herein is a semiconductor processing apparatus comprising a reaction chamber, a heater, a first plasma gas source, a second plasma gas source, a third plasma gas source, a plasma module, one or more precursor sources, and a controller. The reaction chamber comprises a substrate support for supporting a substrate comprising one or more gap features. The heater is constructed and arranged to heat the substrate in the reaction chamber. The first plasma gas source is in fluid communication with the reaction chamber via a first plasma gas valve. The second plasma gas source is in fluid connection via a second plasma gas valve with the reaction chamber. The third plasma gas source is in fluid connection via a third plasma gas valve with the reaction chamber. The plasma module comprises a radio frequency power source constructed and arranged to generate a plasma in the reaction chamber. The one or more precursor sources are in fluid connection with the reaction chamber via one or more precursor valves. The controller is configured for causing the apparatus to perform a method as described herein.

These and other embodiments will become readily apparent to those skilled in the art from the following detailed description of certain embodiments having reference to the attached figures. The invention is not being limited to any particular embodiments disclosed.

BRIEF DESCRIPTION OF THE DRAWING FIGURES

A more complete understanding of the embodiments of the present disclosure may be derived by referring to the detailed description and claims when considered in connection with the following illustrative figures.

Throughout the figures, the following numbering is adhered to: 1—substrate; 2—lower stage/conductive flat-plate electrode; 3—reaction chamber; 4—upper electrode/conductive flat-plate electrode; 5—transfer chamber; 6—exhaust line; 11—interior of a reaction chamber; 12—electrically grounded side; 13—circular duct; 14—separation plate; 16—interior of the transfer chamber; 7—exhaust line; 21—gas line; 22—gas line; 24—gas seal line; 25—power source; 200—substrate; 210—gap feature; 211—upper part; 212—lower part; 311—step of positioning a substrate on a substrate support; 312—step of subjecting the substrate to a first plasma treatment; 313—inter-plasma purge; 314—step of subjecting the substrate to a second plasma treatment; 315—post-plasma purge; 316—step of depositing a material on a lower surface; 317—post-deposition purge; 318—method end; 319—repeat; 411—start; 412—step of exposing a substrate to a precursor; 413—purge; 414—step of subjecting the substrate to a third plasma treatment; 415—purge; 416—end; 417—repeat; 511—start; 512—step of exposing a substrate to an under-dosed halide-containing precursor; 513—purge; 514—step of exposing the substrate to a second precursor; 515—purge; 516—subject the substrate to a nitrogen plasma; 517—purge; 518—step of subjecting the substrate to an oxygen plasma; 519—purge; 520—end; 521—repeat; 710—step of providing a substrate to a reaction chamber; 720—step of generating a nitrogen plasma and a noble gas plasma in the reaction chamber; 730—step of providing a first silicon precursor to the reaction chamber; 740—step of providing a second silicon precursor to the reaction chamber; 750—step of generating a nitrogen plasma and an oxygen plasma in the reaction chamber; 760—end.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, structures, devices and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

In this disclosure, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, a multi-port injection system, other gas distribution device, or the like, can be used for, e.g., sealing the reaction space, and can include a seal gas, such as a rare gas. The terms "rare gas" and "noble gas" as used herein may be used interchangeably. In some cases, the term "precursor" can refer to a compound that participates in the chemical reaction that produces another compound, and particularly to a compound that constitutes a film matrix or a main skeleton of a film, or that is incorporated in a film as a constituent part thereof; the term "reactant" may be used interchangeably with the term precursor.

As used herein, the term "substrate" can refer to any underlying material or materials that can be used to form, or upon which, a device, a circuit, or a film can be formed. A substrate can include a bulk material, such as silicon (e.g., single-crystal silicon), other Group IV materials, such as germanium, or other semiconductor materials, such as a Group II-VI or Group III-V semiconductor, and can include one or more layers overlying or underlying the bulk material.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

As used herein, the term "comprising" indicates that certain features are included, but that it does not exclude the presence of other features, as long as they do not render the claim or embodiment unworkable. In some embodiments, the term "comprising" includes "consisting."

As used herein, the term "consisting" indicates that no further features are present in the apparatus/method/product apart from the ones following said wording. When the term "consisting" is used referring to a chemical compound, it indicates that the chemical compound only contains the components which are listed.

As used herein, the term "purge" refers to a process step in which precursor and/or reactive species are removed from a reaction chamber. During a purge, an inert or substantially inert gas can be provided to the reaction chamber. Additionally or alternatively, the reaction chamber may be evacuated during a purge.

Described herein is a method for filling a gap feature on a substrate surface. The present methods can be used during the manufacture of various semiconductor devices and is particularly useful for filling gap features having a high aspect ratio and a particularly small width, e.g. a width smaller than 10 nm. The method comprises a step of providing a substrate to the reaction chamber. In particular, the substrate is placed on a substrate support in a reaction chamber. The substrate comprises one or more gap features. The one or more gap features comprise an upper part and a lower part. The upper part comprises an upper surface. The lower part comprises a lower surface. The method further comprises a step of subjecting the substrate to a first plasma treatment. Then, the method further comprises a step of subjecting the substrate to a second plasma treatment. It shall be understood that the first and second plasma treatments are different, i.e. not identical. Optionally, the first and second plasma treatments are separated by a purge. It shall be understood that no plasma is generated in the reaction chamber during a purge. After the first and second plasma treatments, a material is selectively deposited on the lower surface. In some embodiments, the gap feature is entirely filled with the material.

Optionally, a purge precedes the step of selectively depositing the material on the lower surface. It shall be understood that no plasma is generated in the reaction chamber during the purge. Also, it shall be understood that the application of the two plasma treatments results in an inhibition of the upper surface whereas the lower surface is left substantially unaffected. In other words, the upper surface can be suitably rendered less reactive towards a precursor that can be subsequently provided to the reaction chamber. Stated differently still, subjecting the substrate to a first plasma treatment and subjecting the substrate to a second plasma treatment can result in an inhibition gradient in the gap feature, wherein the inhibition is stronger in the upper part of the gap than in the lower part of the gap. In other words, the inhibition gradually decreases going from the upper part of the gap to the lower part of the gap. Without the invention being bound to any particular theory or mode of operation, it is believed that the inhibition at the upper surface is caused by depletion of reactive surface groups such as hydroxyl and amine groups near the top of the surface, whereas reactive surface groups near the lower surface, i.e. near the bottom of the trench, are believed to be less, or not, affected by the first and second plasma treatments.

The methods as disclosed herein can be used for various applications, for example for filling a gap feature with seam-free $SiO_2$ for the purpose of shallow trench insulation. Such seam-free shallow trench insulation can advantageously reduce leakage currents, etch resistance, and improve resilience with respect to chemical mechanical polishing processes. In addition, such $SiO_2$ films can have a very low carbon content. In addition, such $SiO_2$ films can have a very low nitrogen content.

In some embodiments, depositing a material on the lower surface is done at a growth rate of at least 0.1 Å/cycle to at most 10 Å/cycle, for example a growth rate of from at least 0.2 Å/cycle to at most 3 Å/cycle, or from at least 0.3 to at most 1 Å/cycle. For example, the material is deposited on the lower surface at a growth rate of at least 0.8 to at most 1.3 Å/cycle. In some embodiments, the growth rate on the upper surface is from at least 2 to at most 20 times slower on the upper surface. In some embodiments, the growth rate on the upper surface is from at least 2 to at most 5 times slower on the upper surface. In some embodiments, the growth rate on the upper surface is from at least 5 to at most 10 times slower on the upper surface. In some embodiments, the growth rate on the upper surface is from at least 10 to at most 20 times slower on the upper surface.

In some embodiments, the first plasma treatment comprises generating a nitrogen plasma in the reaction chamber. A nitrogen plasma may also be referred to as a nitrogen-containing plasma.

In some embodiments, the nitrogen-containing plasma is a $N_2$-containing plasma. In other words, in some embodiments, a plasma gas comprising $N_2$ is used for generating the nitrogen-containing plasma.

In some embodiments, the second plasma treatment comprises generating a noble gas-containing plasma in the reaction chamber. The noble gas-containing plasma, can, for example, be an argon-containing plasma. A noble gas plasma may also be referred to as a noble gas-containing plasma.

In some embodiments, the first plasma treatment comprises generating a nitrogen plasma in the reaction chamber, and the second plasma treatment comprises generating a noble gas plasma in the reaction chamber. In such embodiments, materials such as silicon oxide shallow trench isolation selectively deposited after the first and second plasma treatments can advantageously feature low to negligible C residues, and high quality films. In addition, when the substrate comprises Si fins, these plasma treatments advantageously limit or avoid oxidation of the silicon fins. Additionally, the use of a noble gas plasma after the nitrogen plasma can advantageously reduce or eliminate the amount of N-containing surface groups, also known as nitrogen residues, on the substrate.

In some embodiments, the substrate is maintained at a temperature of at least 75° C. to at most 550° C., or at a temperature of at least 100° C. to at most 300° C.

In some embodiments, the reaction chamber is maintained at a pressure of at least 0.5 Torr to at most 50 Torr, or at a pressure of at least 1 Torr to at most 20 Torr, or at a pressure of at least 2 Torr to at most 10 Torr, for example at a pressure of 6 Torr.

In some embodiments, the first plasma treatment comprises exposing the substrate to a nitrogen plasma, and the plasma gas comprises $N_2$. In some embodiments, $N_2$ is provided to the reaction chamber at a flow rate of at least 200 sccm to at most 2000 sccm, or at a flow rate of at least 400 sccm to at most 1200 sccm, or at a flow rate of at least 600 sccm to at most 1000 sccm. In some embodiments, the nitrogen plasma is generated by means of an RF generator at a plasma power of from at least 100 W to at most 1000 W, for example at a plasma power of at least 200 W to at most 500 W. In some embodiments, the $N_2$ plasma is generated for a duration of at least 0.1 s to at most 50 s, or for a duration of at least 1 s to at most 40 s, or for a duration of at least 5 s to at most 50 s, for example for a duration of at least 10 s to at most 20 s. In some embodiments, the $N_2$ plasma is followed by a purge that lasts from at least 1 s to at most 5 s. It shall be understood that no plasma is generated in the reaction chamber during the purge.

In some embodiments, the second plasma treatment comprises exposing the substrate to an argon plasma, and the plasma gas comprises Ar. In some embodiments, Ar is provided to the reaction chamber at a flow rate of at least 1 slm to at most 10 slm, or at a flow rate of at least 2 slm to at most 5 slm. In some embodiments, the argon plasma is generated by means of an RF generator at a plasma power of from at least 100 W to at most 1000 W, for example at a plasma power of at least 200 W to at most 500 W. In some embodiments, the argon plasma is generated for a duration of at least 0.1 s to at most 50 s, or for a duration of at least 1 s to at most 40 s, or for a duration of at least 5 s to at most 50 s, for example for a duration of at least 10 s to at most 20 s. In some embodiments, the argon plasma is followed by a purge that lasts from at least 0.1 s to at most 2 s, for example from at least 0.2 s to at most 1 s. It shall be understood that no plasma is generated in the reaction chamber during the purge. Note that the above values were given for when a 300 mm wafer is used as a substrate, and that the values can be readily adapted to different substrate sizes, if desired.

In some embodiments, selectively depositing a material on the lower surface comprises a cyclical process. The cyclical process can comprise a plurality of sub cycles. In some embodiments, the cyclical process comprises from at least 2 sub cycles to at most 200 sub cycles. For example, a cyclical deposition process can comprise 2 sub cycles, 3 sub cycles, 5 sub cycles, 10 sub cycles, 20 sub cycles, 30 sub cycles, 60 sub cycles, 100 sub cycles, 200 sub cycles, 500 sub cycles, 1000 sub cycles, 2000 sub cycles, or more. A sub cycle may comprise in the following order: a step of exposing the substrate to a precursor, and a step of exposing the substrate to a third plasma treatment. Optionally, step of exposing the substrate to a precursor is preceded by a purge. Optionally, the step of exposing the substrate to a third plasma treatment is preceded by a purge. It shall be understood that no plasma is generated in the reaction chamber during the purges. The step of exposing the substrate to a precursor results in the formation of chemisorbed precursor on the lower surface. In other words, by exposing the substrate to the precursor, more precursor is chemisorbed on the unpassivated lower surface compared to the plasma-passivated upper surface. In some embodiments, the first and second plasma treatments result in a passivation gradient, i.e. a gradual change of passivation intensity, from the lower surface and to upper surface. In such a case, the step of exposing the substrate to a precursor can result in a gradual change in the density of chemisorbed precursor per unit area from the lower surface to the upper surface. The step of exposing the substrate to a third plasma treatment then allows one or more reactive species comprised in the plasma to react with the chemisorbed precursor to form a material. Since more precursor is chemisorbed on the lower surface compared to the upper surface, more material is formed on the lower surface compared to the upper surface. In other words, the material is selectively grown in a bottom-up way.

In some embodiments, the third plasma treatment comprises generating an oxygen-containing plasma in the reaction chamber. In some embodiments, the oxygen-containing plasma is an $O_2$-containing plasma.

In some embodiments, the precursor comprises a silicon precursor. Thus, the gap can be filled with a silicon-containing material. When the precursor comprises a silicon precursor and the third plasma comprises an oxygen-containing plasma such as an $O_2$ plasma, the material which is deposited comprises silicon oxide. Thus the present methods can be suitably used for filling a gap with silicon oxide in a bottom-up way.

In some embodiments, the silicon precursor comprises an akylaminosilane such as bisdiethylaminosilane diisopropylaminosilane, diisopropylaminotrisilylamine, diisopropylaminodisilane, dimethylaminopentamethyldisilane, or disec-butylaminodisilane.

In some embodiments, the silicon precursor comprises one or more alkylsilyl-substituted linear or cyclic secondary amines, alkylsilazanes, and aminoalkyl-substituted alkoxysilanes. Exemplary silicon precursors include N-methyl-aza-2,2,4-trimethylsilacyclopentane, hexamethyldisilazane, (3-aminopropyl)trimethoxysilane, and 3-methoxypropyltrimethoxysilane.

In some embodiments, the silicon precursor selected from the list comprising diisopropylaminotrisilylamine, diisopropylaminodisilane, dimethylaminopentamethyldisilane, and disec-butylaminodisilane. Such silicon precursors can allow for a high growth per cycle, and can maximize the differences in growth per cycle between the upper surface in the gap and the lower surface in the gap.

In some embodiments, the silicon precursor comprises an amino-substituted cyclosiloxane, for example alkyl- and amino-substituted cyclosiloxane such as 2-diethylamino-2, 4,6,8-tetramethylcyclotetrasiloxane. Such silicon precursors can allow for a high growth per cycle, and can maximize the differences in growth per cycle between the upper surface in the gap and the lower surface in the gap.

In some embodiments, the silicon precursor comprises one or more alkylsilyl-substituted linear or cyclic secondary amines, alkylaminosilanes, alkylsilazanes, alkylsilanes, or aminoalkyl-substituted alkoxysilanes.

In some embodiments, the silicon precursor comprises an alkyl-substituted or unsubstituted heterocyclic compound comprising C, N, and Si in its ring structure, such as N-methyl-aza-2,2,4-trimethylsilacyclopentane.

In some embodiments, the silicon precursor comprises an alkylsilane such as hexamethyldisilazane.

In some embodiments, the silicon precursor comprises an aminoalkyl-substituted alkoxysilane such as (3-aminopropyl)trimethoxysilane.

In some embodiments, the silicon precursor comprises an alkoxysilane such as 3-methoxypropyltrimethoxysilane.

In some embodiments, the step of subjecting the substrate to a first plasma treatment and subjecting the substrate to a second plasma treatment may be repeated one or more times. Thus, in some embodiments, the methods comprise executing a plurality of super cycles. A super cycle comprises the step of subjecting the substrate to the first and second plasma treatments. After the step of subjecting the substrate to the first and second plasma treatments, the super cycle comprises a step of selectively depositing a material on the lower surface. In some embodiments, the method comprise executing the super cycle for at least 100 times to at most 10 000 times, or from at least 200 times to at most 5 000 times, or from at least 500 times to at most 2 000 times.

In some embodiments, the silicon precursor is provided to the reaction chamber in silicon precursor pulses, the pulses having a duration of at least 0.1 s to at most 20 s, or of at least 1 s to at most 10 s, or of at least 3 s to at most 5 s. In some embodiments, the silicon precursor pulses are followed by purges, the purges having a duration of at least 0.2 s to at most 20 s, or of at least 0.5 s to at most 10 s, or of at least 1 s to at most 5 s. It shall be understood that no plasma is generated in the reaction chamber during the purge.

In some embodiments, the third plasma treatment comprises exposing the substrate to an oxygen plasma, and $O_2$ is used as a plasma gas. In some embodiments, $O_2$ is provided to the reaction chamber at a flow rate of a least 100 sccm to at most 10 000 sccm, or at a flow rate of at least 200 sccm to at most 5000 sccm, or at a flow rate of at least 500 sccm to at most 1000 sccm. In some embodiments, the oxygen plasma is generated by means of an RF generator operating at a plasma power of at least 50 W to at most 200 W. In some embodiments, the oxygen plasma is, during an oxygen plasma pulse, generated for at least 0.1 s to at most 10 s, or for at least 0.2 s to at most 5 s, or for at least 0.5 s to at most 2 s. In some embodiments, exposing the substrate to an oxygen plasma is followed by a purge, the purge lasting from at least 0.2 s to at most 10 s, or from at least 1 s to at most 5 s. It shall be understood that no plasma is generated in the reaction chamber during the purge.

In some embodiments, the material can be selectively deposited using two different precursors: a halide-containing precursor and a second precursor. In some embodiments, selectively depositing a material on the lower surface comprises a cyclical process. The cyclical process comprising a plurality of sub cycles. For example, a sub cycle can comprise 2 sub cycles, 3 sub cycles, 4 sub cycles, 8 sub cycles, 16 sub cycles, 32 sub cycles, 64 sub cycles, or more. In some embodiments, the cyclical process comprises from at least 2 sub cycles to at most 200 sub cycles. A sub cycle may comprise, in the following order: a step of exposing the substrate to an under-dosed halide-containing precursor, a step of exposing the substrate to a second precursor, a step of exposing the substrate to a nitrogen plasma comprising one or more reactive nitrogen species, and a step of exposing the substrate to an oxygen plasma. In some embodiments, the step of exposing the substrate to the under-dosed halide-containing precursor is preceded by a purge. Optionally, the step of exposing the substrate to the second precursor is preceded by a purge. Optionally, the step of exposing the substrate to the nitrogen plasma is preceded by a purge. Optionally, the step of exposing the substrate to an oxygen plasma is preceded by a purge. It shall be understood that no plasma is generated in the reaction chamber during a purge.

The step of exposing the substrate to an under-dosed halide-containing precursor results in chemisorption of the halide-containing precursor on the upper surface, but not, or at least to a lesser degree, on the lower surface. Indeed, by under-dosing the halide-containing precursor, this precursor does not, or not substantially, diffuse to the bottom of gap features comprised in the substrate, but does reach the upper surface of the gap. It shall be understood that under-dosing refers to a process of exposing a substrate to an amount of precursor which is sufficiently low that chemisorption of the precursor at the lower surface of the gap occurs in a diffusion-limited, i.e. a transport-limited, regime. At the surface of the substrate outside of gaps, and the upper surface of the gaps, precursor chemisorption can, but does not need to, occur in a self-saturating regime. This can be done, for example, by exposing the substrate to a relatively large amount of halide-containing precursor for a relatively short amount of time, e.g. for from at least 0.01 seconds to at most 0.2 seconds, e.g. for about from at least 0.05 seconds to at most 0.1 seconds.

The step of exposing the substrate to a second precursor results in chemisorption of the second precursor on the lower surface of the gap. It shall be understood that the second precursor is different from the first precursor. In some embodiments, the second precursor does not contain any halogens.

During the step of exposing the substrate to a nitrogen-containing plasma comprising one or more reactive nitrogen species, the reactive nitrogen species react with the chemisorbed halide-containing precursor to form a nitrogen and halogen containing etchant that, in turn, can proceed to etch the surface locally. Exemplary halogen containing etchants include fluorine-containing etchants, such as fluorine and nitrogen containing etchants, such as an etchant selected from $NF_3$, $NF_2$, NF. In some embodiments, the fluorine containing etchant comprises at least one of fluorine radicals and fluorine ions. Since the halide-containing precursor is primarily, or only, chemisorbed at the upper surface of the gap, in other words near the top of the gap, the etchant is mostly, or only, generated at the upper surface of the gap, in other words near the top of the gap. Stated differently, the etchant is produced in an anisotropic way, and therefore the etchant preferentially etches material, e.g. deposited material, near the top of the gap. Thus, the formation of the etchant can enhance filling the gap in a bottom-up way, without forming any substantial seam.

The step of exposing the substrate to an oxygen plasma suitably allows one or more one or more oxygen-containing reactive species comprised in the plasma to react with the chemisorbed precursor on the lower surface. Thus, an oxide is formed on the lower surface, and an oxide can be grown in a bottom-up way in the gap.

The step of exposing the substrate to an oxygen plasma results in the reaction of one or more reactive oxygen species comprised in the plasma with the chemisorbed precursor. Thus, silicon oxide is selectively grown on the lower surface. It shall be understood that a small amount of an oxide can be deposited on the lower surface in this way, and that the gap feature can be filled with an oxide in a bottom up way by repeating the cycle an appropriate amount of times. In some embodiments, subjecting the substrate to a first plasma treatment and then subjecting the substrate to a second plasma treatment is repeated one or more times. In other words, and in some embodiments, the step of subjecting the substrate to a first plasma treatment and subjecting the substrate to a second plasma treatment occurs a plurality of times. Thus, in some embodiments, the method comprises executing one or more, e.g. a plurality, of super cycles. A super cycle comprises, in the following order: the step of subjecting the substrate to a first plasma treatment and subjecting the substrate to a second plasma treatment; the step of step of exposing the substrate to an under-dosed halide-containing precursor; the step of exposing the substrate to a second precursor; the step of exposing the substrate to a nitrogen plasma; and, the step of exposing the substrate to an oxygen plasma.

In some embodiments, the halide-containing precursor is a halide-containing silicon precursor. This is particularly useful for filling the gap with silicon oxide. Suitable halide-containing silicon precursors include halogenated alkoxysilanes such as trimethoxy(3,3,3-trifluoropropyl)silane and nonafluorohexyl-trimethoxysilane.

In some embodiments, the second precursor is a second silicon precursor. In other words, in some embodiments, the second precursor comprises silicon. This is particularly useful for filling the gap with silicon oxide. In some embodiments, the second silicon precursor comprises Si, C, H, and N. In some embodiments, the second silicon precursor comprises an alkylaminosilane such as bisdiethylaminosilane or diisopropylaminosilane. In some embodiments, such alkylaminosilanes can suitably yield a growth rate of from at least 0.1 Å/cycle to at most 10 Å/cycle, for example a growth rate of 1 Å/cycle.

In some embodiments, the second silicon precursor selected from the list comprising diisopropylaminotrisilylamine, diisopropylaminodisilane, dimethylaminopentamethyldisilane, and disec-butylaminodisilane. Such silicon precursors can allow for a high growth per cycle, and can maximize the differences in growth per cycle between the upper surface in the gap and the lower surface in the gap.

In some embodiments, the second silicon precursor comprises an amino-substituted cyclosiloxane, for example alkyl- and amino-substituted cyclosiloxane such as 2-diethylamino-2,4,6,8-tetramethylcyclotetrasiloxane. Such silicon precursors can allow for a high growth per cycle, and can maximize the differences in growth per cycle between the upper surface in the gap and the lower surface in the gap.

In some embodiments, the second silicon precursor comprises one or more alkylsilyl-substituted linear or cyclic secondary amines, alkylaminosilanes, alkylsilazanes, alkylsilanes, or aminoalkyl-substituted alkoxysilanes.

In some embodiments, the second silicon precursor comprises an alkyl-substituted or unsubstituted heterocyclic compound comprising C, N, and Si in its ring structure, such as N-methyl-aza-2,2,4-trimethylsilacyclopentane.

In some embodiments, the second silicon precursor comprises an alkylsilane such as hexamethyldisilazane.

In some embodiments, the second silicon precursor comprises an aminoalkyl-substituted alkoxysilane such as (3-aminopropyl)trimethoxysilane.

In some embodiments, the second silicon precursor comprises an alkoxysilane such as 3-methoxypropyltrimethoxysilane.

In some embodiments, the second silicon precursor comprises an alkylaminosilane, in particular an alkyl amine-substituted monosilane such as bisdiethylaminosilane and diisopropylaminosilane. With such precursors, a growth rate of around 1 Å/cycle can be obtained.

In some embodiments, the second silicon precursor comprises a higher order silane such as an alkylamine-substituted higher order silane, such as an alkylamine-substituted disilane or trisilane. For example, the second silicon precursor may comprise a dialkylamine-substituted disilane or trisilane such as diisopropylaminotrisilylamine, diisopropylaminodisilane, dimethylaminopentamethyldisilane, and disec-butylaminodisilane. Additionally, the second silicon precursor comprises a cyclosiloxane, for example an alkyl and alkylamino-substituted cyclosiloxane. For example, the silicon precursor may comprise an alkyl- and dialkylamino-substituted cyclosiloxane such as 2-diethylamino-2,4,6,8-tetramethylcyclotetrasiloxane. Advantageously, such precursors can offer a high growth rate, e.g. a growth rate of more than 1 Å/cycle. In addition, the use of such precursors can advantageously enhance the growth rate difference of a silicon-containing material such as silicon oxide between the upper surface of a gap feature and the lower surface of a gap feature.

In some embodiments, the material comprises silicon oxide, and the silicon oxide can be selectively deposited on the lower surface of the trench using a silicon precursor which has a comparatively low reactivity. Thus, in some embodiments, the material comprises silicon oxide and selectively depositing the silicon oxide on the lower surface comprises a cyclical process. The cyclical process comprises a plurality of sub cycles, for example 2 sub cycles, 3 sub cycles, 4 sub cycles, 8 sub cycles, 16 sub cycles, 32 sub cycles, 64 sub cycles, or more. In some embodiments, the cyclical process comprises from at least 2 sub cycles to at most 200 sub cycles. A sub cycle comprises, in the given order: a step of exposing the substrate to a silicon precursor, and a step of exposing the substrate to an oxygen plasma. Optionally, the step of exposing the substrate to a silicon precursor is preceded by a purge. Optionally, the step of exposing the substrate to an oxygen plasma is preceded by a purge. It shall be understood that no plasma is generated in the reaction chamber during the purges.

The step of exposing the substrate to a silicon precursor results in the formation of chemisorbed silicon precursor on the lower surface. In other words, the silicon precursor preferentially chemisorbs on the lower surface with respect to the upper surface. The silicon precursor can suitably comprise one or more alkylsilyl-substituted linear or cyclic secondary amines, alkylsilazanes, and aminoalkyl-substituted alkoxysilanes. Exemplary silicon precursors include substituted or unsubstituted heterocyclic compounds comprising C, N, and Si in their ring structure such as N-methyl-aza-2,2,4-trimethylsilacyclopentane; alkyl-substituted linear or cyclic silazanes such as hexamethyldisilazane; aminoalkyl-substituted alkoxysilanes such as (3-aminopropyl)trimethoxysilane; and alkoxysilanes such as 3-methoxypropyltrimethoxysilane. Advantageously, such precursors can, under appropriate conditions, have a relatively low reactivity towards surface groups such as hydroxyl or amine groups. Accordingly, weak chemisorption occurs, especially on plasma-inhibited surfaces on which at most a very limited amount of chemisorption occurs. Thus the growth rate on the upper surface of a gap feature can be made very low, thereby enhancing selectivity of the growth on the lower surface of the gap feature.

In some embodiments, subjecting the substrate to a first plasma treatment and then subjecting the substrate to a second plasma treatment is repeated one or more times. In other words, and in some embodiments, the step of subjecting the substrate to a first plasma treatment and subjecting the substrate to a second plasma treatment occurs a plurality of times. Thus, in some embodiments, the method comprises executing one or more, e.g. a plurality of, super cycles. A super cycle comprises, in the following order: the step of subjecting the substrate to a first plasma treatment and subjecting the substrate to a second plasma treatment; and, the step of selectively depositing the silicon oxide on the lower surface. Thus, very deep gaps can be efficiently filled even when the effect of the first and second plasma treatments wears off after a certain number of cycles.

Further described herein is a semiconductor processing apparatus. The semiconductor processing apparatus is suitable for performing a method as disclosed herein. The semiconductor processing apparatus comprises a reaction chamber comprising a substrate support for supporting a substrate. The substrate comprises one or more gaps. The semiconductor processing apparatus further comprises a heater, a first plasma gas source, a second plasma gas source, a third plasma gas source, a plasma module, and a controller. The heater is constructed and arranged to heat the substrate in the reaction chamber. The first, second, and third plasma gas sources are in fluid communication with the reaction chamber respectively via a first, second, and third plasma gas valve. The plasma module comprises a radio frequency power source constructed and arranged to generate a plasma in the reaction chamber. The semiconductor processing apparatus further comprises at least one precursor source in fluid communication within the reaction chamber via one or more precursor valves. Suitably, the semiconductor processing apparatus can further comprise an exhaust for exhausting reaction products, carrier gas, and unused precursor and co-reactant. The controller can comprise suitable electronics such as one or more memories and processors, and is configured, i.e. programmed, for causing the apparatus to perform a method as described herein. It shall be understood that the controller is communicated with the various power sources, heating systems, pumps, robotics, and gas flow controllers or valves of the reactor, as will be appreciated by the skilled artisan.

In some embodiments, the semiconductor processing apparatus comprises one precursor source. In some embodiments, the semiconductor processing apparatus comprises two precursor sources.

Optionally, the system is configured for providing at least one of the precursors to the reaction chamber by means of a carrier gas. Suitable carrier gasses include noble gasses. In other words, in some embodiments, the semiconductor processing system comprises a gas injection system comprising a precursor delivery system that employs a carrier gas for carrying the precursor to one or more reaction chambers.

Figure 1:
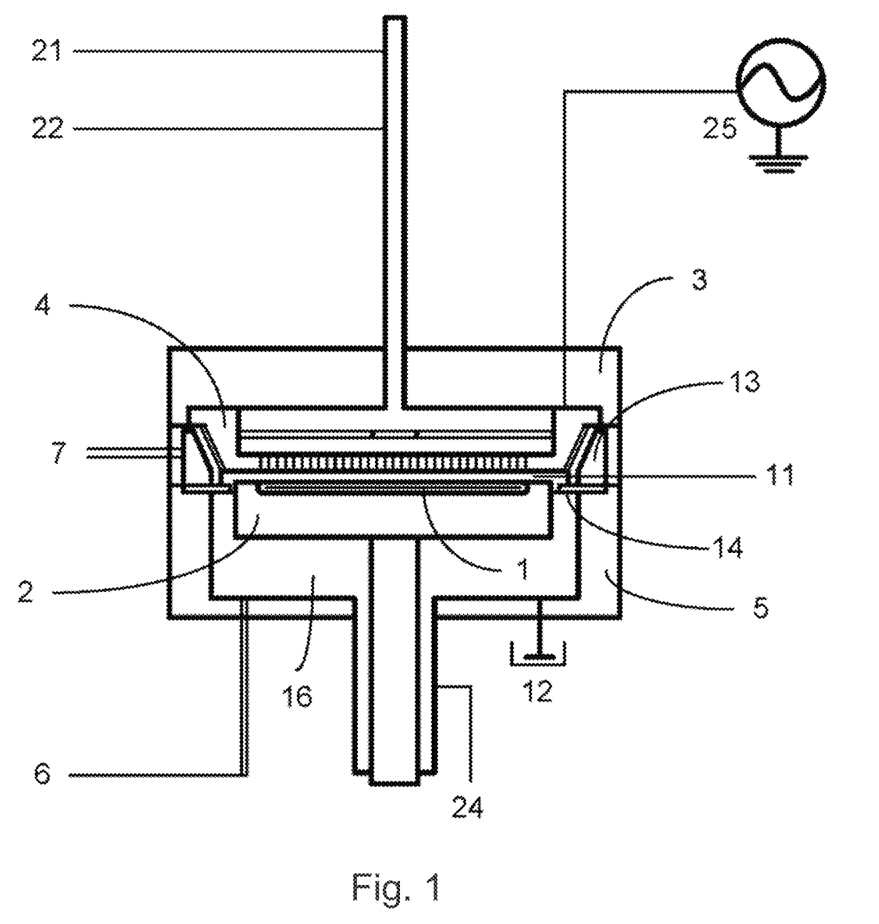
FIG. 1 is a schematic representation of a plasma-enhanced atomic layer deposition (PEALD) apparatus suitable for depositing a structure and/or for performing a method in accordance with at least one embodiment of the present disclosure.

The presently provided methods may be executed in any suitable apparatus, including in an embodiment of a semiconductor processing system as shown in FIG. 1. FIG. 1 is a schematic view of a plasma-enhanced atomic layer deposition (PEALD) apparatus, usable in some embodiments of the present invention. In this figure, by providing a pair of electrically conductive flat-plate electrodes (2,4) in parallel and facing each other in the interior (11) (reaction zone) of a reaction chamber (3), applying RF power (e.g. at 13.56 MHz and/or 27 MHz) from a power source (25) to one side, and electrically grounding the other side (12), a plasma can be generated between the electrodes. Of course, there is no need for the semiconductor processing apparatus to generate a plasma during the steps when a precursor is provided to the reaction chamber, and no RF power need be applied to any one of the electrodes during those steps. A temperature regulator may be provided in a lower stage (2), i.e. the lower electrode. A substrate (1) is placed thereon and its temperature is kept constant at a given temperature. The upper electrode (4) can serve as a shower plate as well, and various gasses such as a plasma gas, a reactant gas and/or a dilution gas, if any, as well as a precursor gas can be introduced into the reaction chamber (3) through a gas line (21) and a gas line (22), respectively, and through the shower plate (4). Additionally, in the reaction chamber (3), a circular duct (13) with an exhaust line (7) is provided, through which the gas in the interior (11) of the reaction chamber (3) is exhausted. Additionally, a transfer chamber (5) is disposed below the reaction chamber (3) and is provided with a gas seal line (24) to introduce seal gas into the interior (11) of the reaction chamber (3) via the interior (16) of the transfer chamber (5) wherein a separation plate (14) for separating the reaction zone and the transfer zone is provided. Note that a gate valve through which a wafer may be transferred into or from the transfer chamber (5) is omitted from this figure. The transfer chamber is also provided with an exhaust line (6). In some embodiments, the deposition of the silicon oxide and the surface treatment are performed in the same reaction space, so that all the steps can continuously be conducted without any need for intermediate steps of evacuating reaction chambers, pumping down reaction chambers, or exposing the substrate to atmospheric air.

Figure 2:
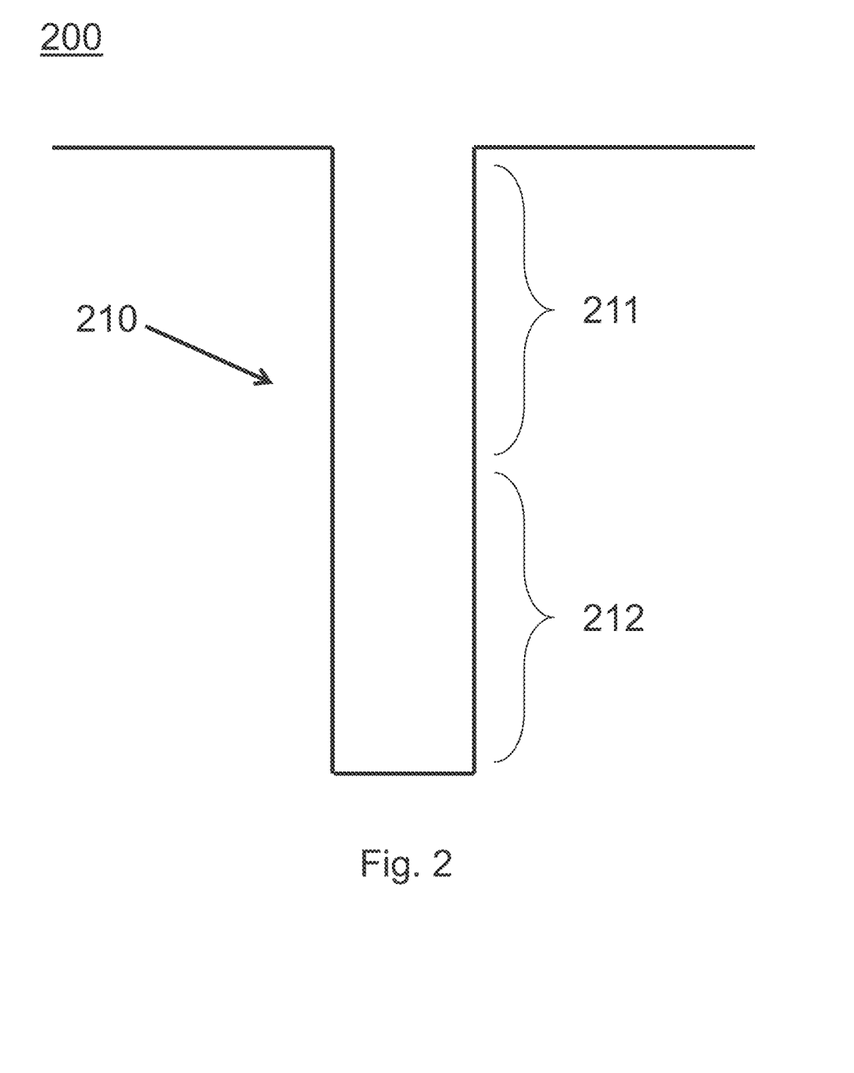
FIG. 2 shows a schematic representation of a substrate (200) comprising a gap feature (210).

FIG. 2 shows a schematic representation of a substrate (200) comprising a gap feature (210). The gap feature (210)

comprises an upper part (211) and a lower part (212). The upper part (211) comprises an upper surface, and the lower part (212) comprises a lower surface. By subjecting the substrate (200) to a first plasma treatment and a second plasma treatment, the upper surface can be substantially inhibited. In other words, the first and second plasma treatments can suitably render the upper surface relatively unreactive towards a precursor compared to the lower surface.

Figure 3:
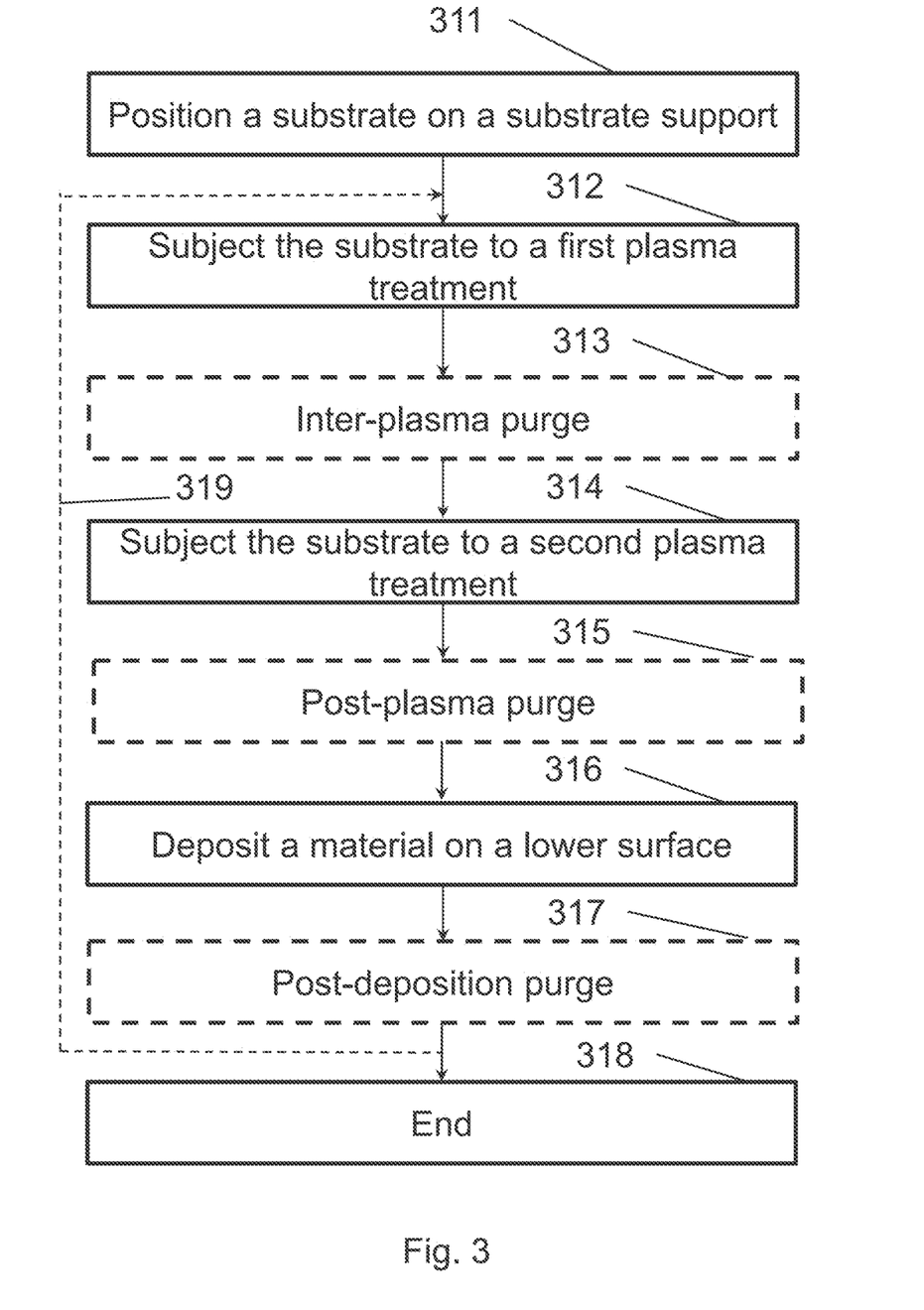
FIG. 3 shows a flow chart of an embodiment of a method as described herein.

FIG. 3 shows a schematic representation of an embodiment of a method as described herein. The method comprises a step (311) of positioning a substrate on a substrate support. The substrate comprises a gap feature. The substrate is then subjected to a first plasma treatment (312) as described herein. Optionally, the reaction chamber is then purged using an inter-plasma purge (313). Purging can be done, for example, by means of a substantially inert gas such as a noble gas. Exemplary noble gasses include He, Ne, Ar, Xe, and Kr. The method further comprises a step (314) of subjecting the substrate to a second plasma treatment as described herein. Optionally, the reaction chamber is then purged using a post-plasma purge (315). The method further comprises a step (316) of depositing a material on the lower surface of the gap feature, by means of a technique as described herein. Optionally, the reaction chamber is then purged using a post-deposition purge (317). It shall be understood that no plasma is generated in the reaction chamber during the purges. The steps from subjecting the substrate to a first plasma treatment (312) to the step of depositing a material on the lower surface of the gap feature can optionally be repeated (319) one or more times, thereby resulting in a plurality of super-cycles comprising subsequent first and second plasma treatments followed by a deposition. Thus, a material is deposited in the gap feature. When a desired amount of material has been deposited in the gap, the method ends (318).

Figure 4:
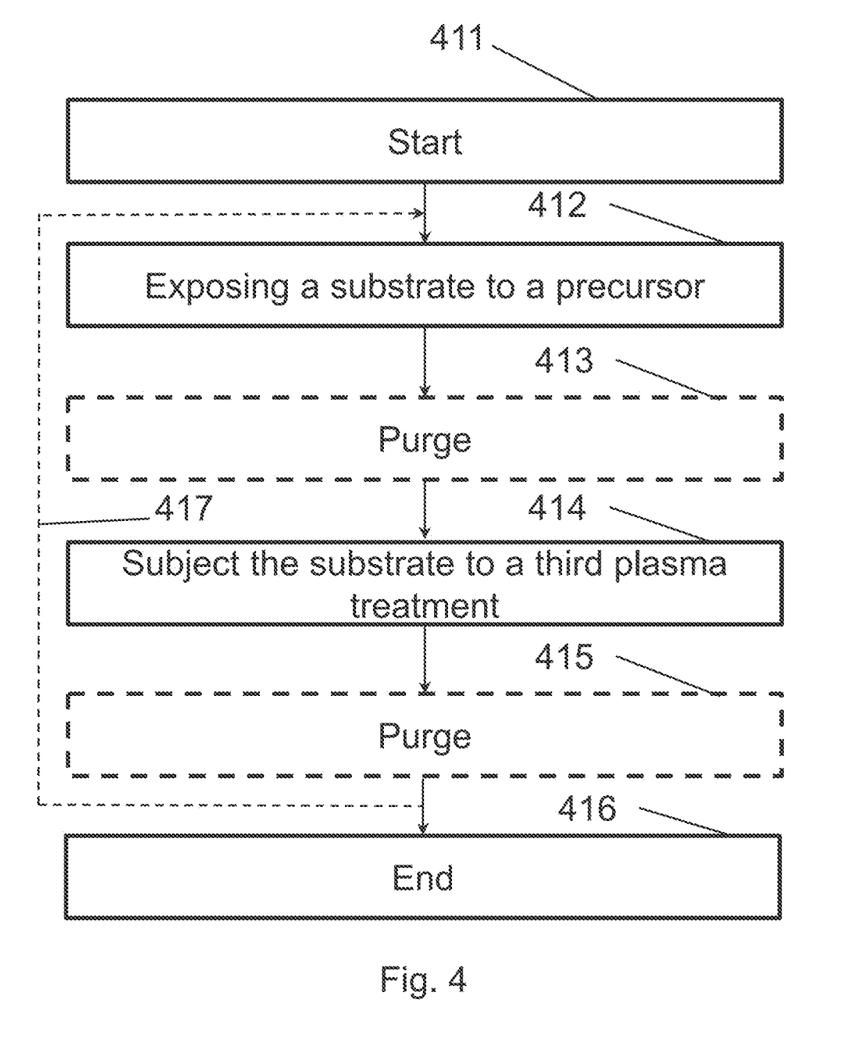
FIG. 4 shows a flow chart of an embodiment of a method as described herein.

FIG. 4 shows a schematic representation of an embodiment of a part of a method for selectively depositing a material on the lower surface of a gap feature comprised in a substrate. The part of the method shown in FIG. 4 corresponds to the step of depositing a material on a lower surface (316) as shown in FIG. 3 and starts (411) after a step of subjecting the substrate to a first plasma treatment and subjecting the substrate to a second plasma treatment, or optionally after a purge following such a step. The substrate is exposed to a precursor (412) which chemisorbs on the lower surface, as described herein. Optionally, the reaction chamber is then purged (413). The method then comprises a step of subjecting the substrate to a third plasma treatment (414). Optionally, the reaction chamber is then purged (415). It shall be understood that no plasma is generated in the reaction chamber during the purges. The steps from exposing the substrate to a precursor (412) to the step of subjecting the substrate to a third plasma treatment (414) can optionally be repeated (417) one or more times, thereby resulting in a plurality of sub-cycles. Thus, a material is deposited in the gap feature. When a desired amount of material has been deposited in the gap, the method ends (416).

In an exemplary embodiment of a method according to FIG. 4, the first plasma treatment employs a nitrogen plasma, the second plasma treatment employs a noble gas plasma, the precursor is a silicon precursor, the third plasma comprises an oxygen plasma, and the material comprises silicon oxide. In particular, the silicon precursor can be selected from a substituted or unsubstituted heterocyclic compound comprising Si, C, and N in its ring structure such as N-Methyl-aza-2,2,4-trimethylsilacyclopentane; an alkylsilazane such as hexamethyldisalazane; and an alkoxysilane such as (3-Aminopropyl)trimethoxysilane or 3-methoxypropyltrimethoxysilane. Using an $O_2$ plasma as the oxygen plasma, silicon oxide was grown at the following growth rates on an unpassivated hydroxyl-terminated surface: 0.6 Å/cycle when N-Methyl-aza-2,2,4-trimethylsilacyclopentane is used as silicon precursor at a substrate temperature of 300° C.; 0.25 Å/cycle when hexamethyldisalazane is used as silicon precursor at a substrate temperature of 100° C.; 0.63 Å/cycle when (3-Aminopropyl)trimethoxysilane is used as silicon precursor at a substrate temperature of 100° C.; and 0.39 Å/cycle when 3-methoxypropyltrimethoxysilane is used as a silicon precursor at a substrate temperature of 100° C. Thus, these precursors have a relatively low growth rate, suggesting a weak reactivity towards plasma-inhibited surfaces. Thus, such precursors can be advantageously used in the methods described herein, and allow filling gap features in a bottom up way, without formation of a seam.

Figure 5:
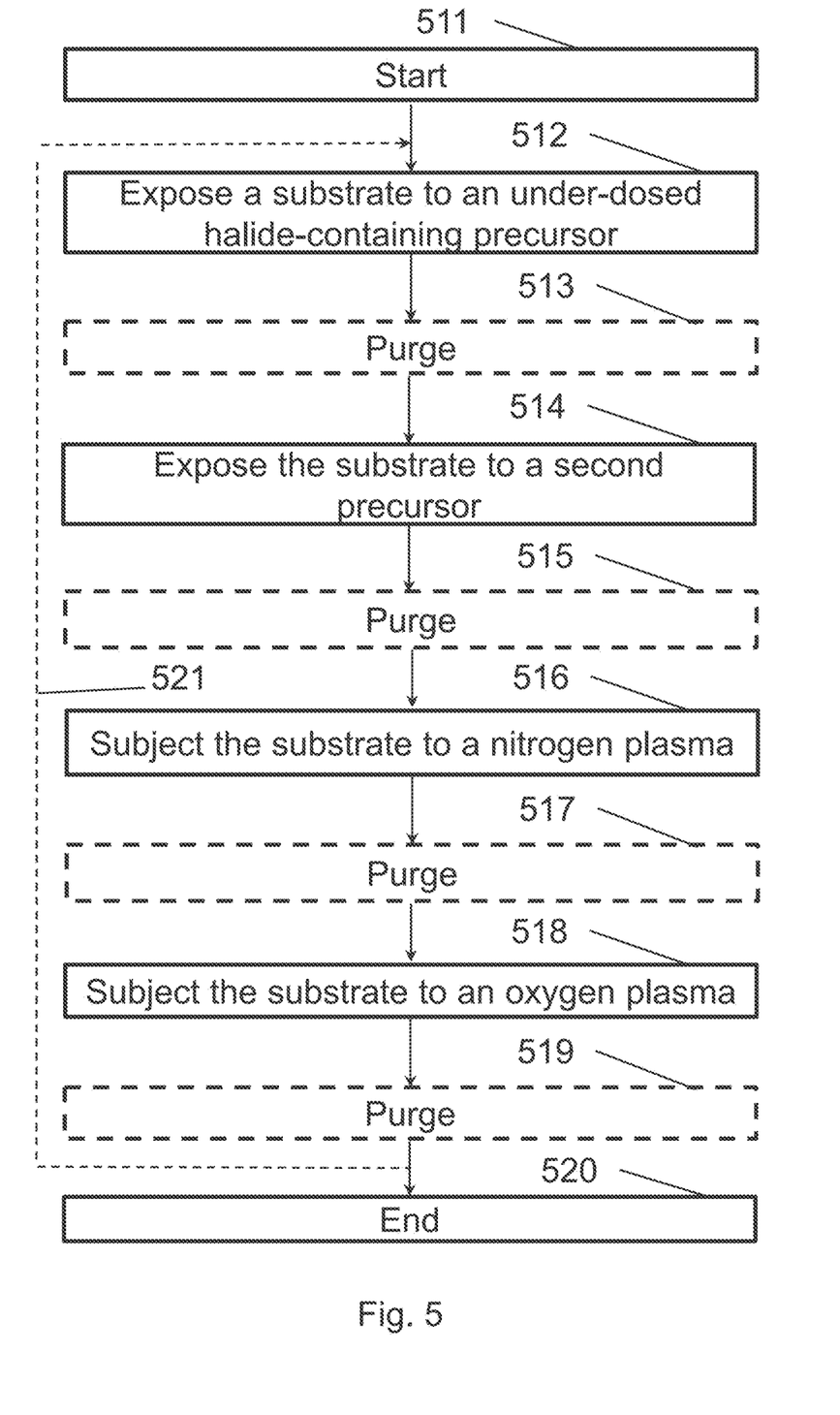
FIG. 5 shows a flow chart of an embodiment of a method as described herein.

FIG. 5 shows a schematic representation of an embodiment of a part of a method for selectively depositing a material on the lower surface of a gap feature comprised in a substrate. The part of the method shown in FIG. 5 corresponds to the step of depositing a material on a lower surface (316) as shown in FIG. 3 and starts (511) after a step of subjecting the substrate to a first plasma treatment and subjecting the substrate to a second plasma treatment, or optionally after a purge following such a step. The method then comprises a step (512) of exposing the substrate to an under-dosed halide-containing precursor as described herein. Optionally, this step is followed by a purge (513). Then, the method comprises a step (514) of exposing the substrate to a second precursor. Optionally, this step is followed by a purge (515). Then, the substrate is subjected to a nitrogen plasma (516). Optionally, this step is followed by a purge (517). Then, the substrate is subjected to an oxygen plasma (518). Optionally, this step is followed by a purge (519). The steps from exposing the substrate to an under-dosed halide-containing precursor (512) to the step of subjecting the substrate to an oxygen plasma (518) can optionally be repeated (521) one or more times, thereby resulting in a plurality of sub-cycles. Optionally, subsequent sub-cycles can be separated by an inter-cycle purge. It shall be understood that no plasma is generated in the reaction chamber during the purges. Thus, a material is deposited in the gap feature. When a desired amount of material has been deposited in the gap, the method ends (520).

Figure 6:
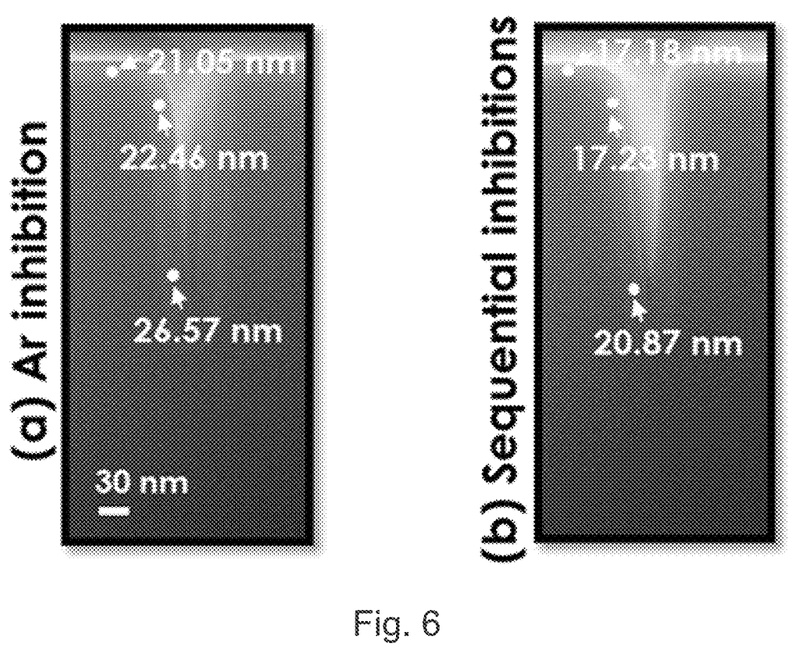
FIG. 6 shows SEM micrographs of gap features that are partially filled with silicon oxide.

FIG. 6 shows cross-sectional scanning electron microscopy (SEM) images of partially filled gap features made by means of an embodiment of a method as disclosed. In particular, panel a) shows results of a comparative process in which a gap feature was filled with silicon oxide using a sequential deposition process comprising alternating argon plasma treatments for inhibition of the upper surface of the gap feature, and deposition sequences for depositing silicon oxide on the lower surface of the gap. Panel b) shows results of an embodiment of a method as disclosed herein in which a gap feature was filled with silicon oxide using a sequential deposition process comprising alternating two-step plasma treatments for inhibition of the gap feature, and deposition sequences for depositing silicon oxide on the lower surface of the gap. The two-step plasma treatment comprises the application of a nitrogen plasma followed by the application of an argon plasma.

The following process conditions were used in a comparative process the results of which are shown in panel a): Si precursor pulse time: 4 s; purge time after Si precursor pulse: 2 s; Ar flow rate: 3.7 slm; $O_2$ flow rate: 800 sccm; RF plasma power during Ar plasma: 300 W; Ar plasma on time: 15 s; purge time after Ar plasma: 0.5 s; RF plasma power during $O_2$ plasma: 100 W; oxygen plasma on time: 1 s; purge time after oxygen plasma: 2 s; pressure: 5 torr; susceptor temperature: 428.

The following process conditions were used in an embodiment of a method as described herein the results of which are shown in panel b): $N_2$ flow rate 800 sccm; RF plasma power during $N_2$ plasma: 300 W; $N_2$ plasma on time: 15 s; purge time after $N_2$ plasma: 2 s; Ar flow rate: 3.7 slm; RF plasma power during Ar plasma: 300 W; Ar plasma on time: 15 s; purge time after Ar plasma: 0.5 s; Si precursor pulse time: 4 s; purge time after Si precursor pulse: 2 s; $O_2$ flow rate: 800 sccm; RF plasma power during $O_2$ plasma: 100 W; oxygen plasma on time: 1 s; purge time after oxygen plasma: 2 s; pressure: 5 torr; susceptor temperature: 300° C.; number of cycles: 645. Note that the above values were given for a 300 mm wafer, and that the values can be readily adapted to other substrate sizes.

In experiments the results of which are shown in FIG. 6, it was found that sequential inhibitions significantly inhibit the top surface with a very low growth rate at the upper surface of 0.27 Å/cycle, compared to the case of an Ar plasma inhibition only, in which case the growth rate at the upper surface is 0.49 Å/cycle. Without inhibition, a growth rate of around 1 Å/cycle was observed. Without the invention being bound to any particular theory or mode to operation, it is believed that very little chemisorption of Si precursors occurs when sequential $N_2$ plasma and Ar plasma inhibitions are used. Moreover, a bottom-heavy profile is observed, indicating a thicker film deposited on the bottom of the sidewall by sequential inhibitions. As a result, this sequential, i.e. 2-step plasma, inhibition can help achieving seamlessly filling gap features, e.g. in shallow trench isolation downscaling.

In a further experiment, N 1s XPS (X-ray photoelectron spectroscopy) measurements were performed on $SiO_2$ films deposited by means of an embodiment of a method as described herein. If features the application of a $N_2$ plasma and a subsequent Ar plasma. The XPS measurements indicated that no $N_2$ residues were observed in the $SiO_2$ films under study. The following process conditions were used in this embodiment of a method as described herein: $N_2$ flow rate: 100 sccm; RF plasma power during $N_2$ plasma 300 W; $N_2$ plasma on time: 15 s; purge time after $N_2$ plasma: 2 s; Ar flow rate: 3.7 slm; RF plasma power during Ar plasma: 300 W; Ar plasma on time: 15 s; purge time after Ar plasma: 0.5 s; Si precursor pulse time: 4 s; purge time after Si precursor pulse: 2 s; $O_2$ flow rate: 800 sccm; RF plasma power during $O_2$ plasma: 500 W; oxygen plasma on time: 1 s; purge time after oxygen plasma: 2 s; pressure: 5 torr; susceptor temperature: 300° C.; number of cycles: 555. It was found that such $SiO_2$ films have a wet etch rate of only 2.4 Å/min in diluted HF (0.5 wt. % HF in $H_2O$), thus indicating an excellent film quality and obviating the need for any post deposition anneal. This can be particularly useful when the $SiO_2$ is deposited on a substrate comprising thin silicon films: since no post deposition anneal is needed, there is no risk of fin inadvertent fin oxidation.

Figure 7:
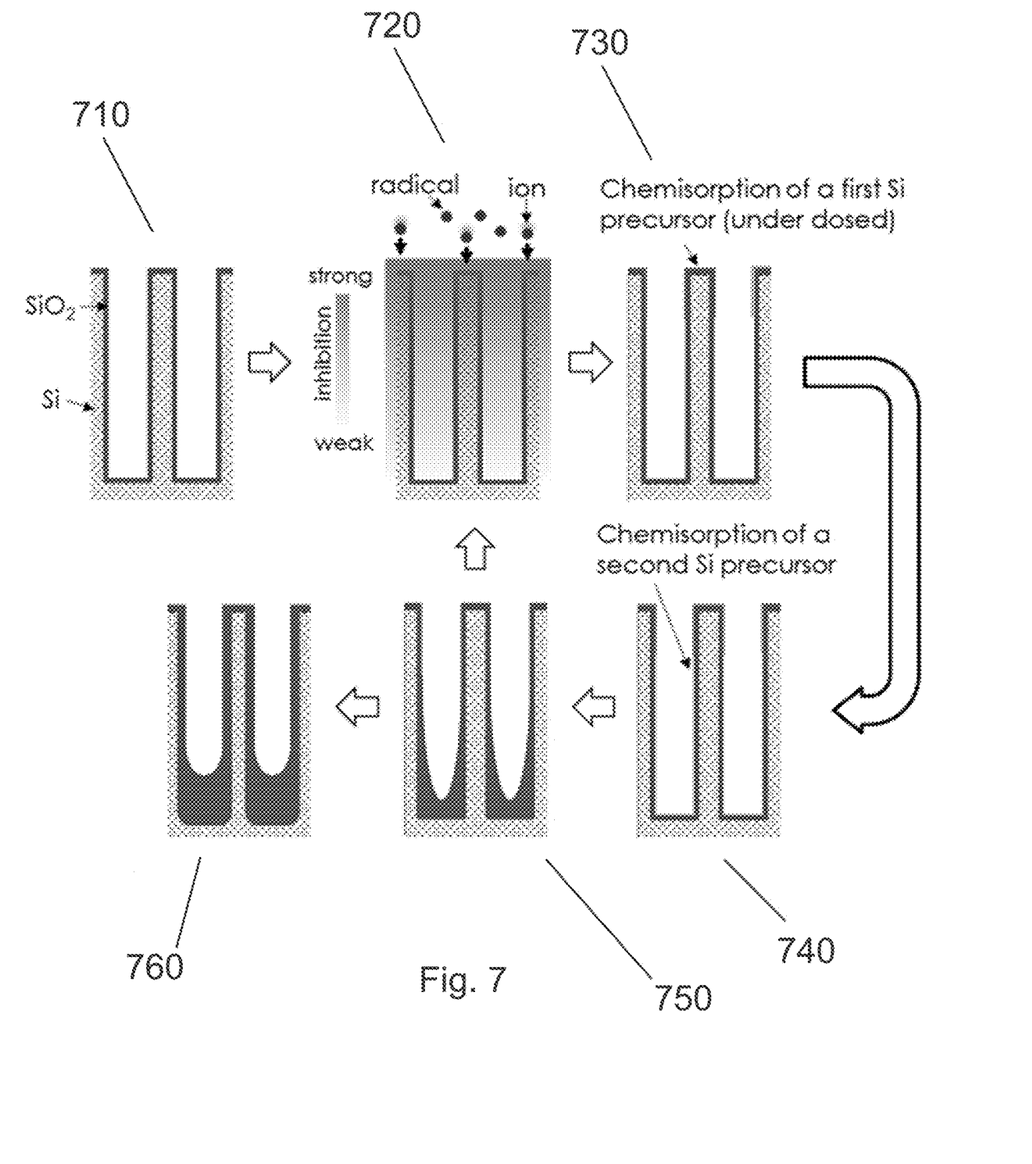
FIG. 7 shows a schematic representation of various steps in an embodiment of a method as described herein.

FIG. 7 shows a specific embodiment of a method as shown in FIG. 5. In particular, the halide-containing precursor is a halide-containing silicon precursor, and the second precursor is a second silicon precursor. In such embodiments, the method of FIG. 5 can be particularly advantageous for seamlessly filling a gap feature with silicon oxide. In particular the method comprises a step (710) of positioning a substrate on a substrate support in a reaction chamber. The substrate comprises one or more gap features. The one or more gap features comprise an upper part comprising an upper surface and a lower part comprising a lower surface. The method further comprises a step (720) of subjecting the substrate to a first plasma treatment and a second plasma treatment. Thus, the upper surface is inhibited while leaving the lower surface substantially unaffected. Without the presently disclosed methods being bound by any particular theory or mode of operation, it is believed that a sequence of a first plasma treatment, e.g. a nitrogen plasma, and a second plasma treatment, e.g. a noble gas plasma, can result in the formation of reactive sites such as surface amine groups which have lower reactivity compared to hydroxyls and dangling bonds. The top of the trench is more affected by the plasma inhibitions than the bottom, which allows seamless deposition. The method further comprises a step (730) of providing a halide-containing silicon precursor to the reaction chamber. In particular, the halide-containing silicon precursor is under-dosed, i.e. a relatively low amount of halide-containing silicon precursor is provided to the reaction chamber such that the surface reactions of the halide-containing silicon precursor occur in a regime which is not self-saturating. Doing so results in more chemisorption of halide-containing silicon precursor on upper surfaces of gap features compared to lower surfaces of gap features. In other words, the halide-containing silicon precursor preferentially chemisorbs on the top of a gap feature such as a trench. Then, the method comprises a step (740) of providing a second silicon precursor to the reaction chamber. The second silicon precursor preferably halogen-free, and is provided to the reaction chamber in a regime such that chemisorption of the second silicon precursor self-saturates. Since the halide-containing silicon precursor already occupies reactive surface sites at the top of the gap features, the second silicon precursor preferentially chemisorbs at the bottom of gap features. Then, the method comprises a further plasma treatment step (750) comprising the application of a nitrogen plasma and an oxygen plasma. The nitrogen plasma is generated in the reaction chamber, which can result in the formation of etchants such as $NF_x$, $NCl_x$, $NBr_x$, $NI_x$, and halide radicals. Since the etchants are generated through interaction with the $N_2$ plasma with the chemisorbed halide-containing silicon precursor, such etchants are preferentially generated at the top of the trench. Accordingly, any silicon oxide which is formed at the top of the trench during previous cycles can be anisotropically etched, i.e. it can be preferentially etched at the top of the trench. After the nitrogen plasma, an oxygen plasma is generated in the reaction chamber, and reactive species in the oxygen plasma can react with the second silicon precursor which is preferentially chemisorbed at the bottom of the gap features to form silicon oxide. Thus, silicon oxide is grown in the gap feature in a bottom-up fashion. Steps (720) to (750) can be repeated any desired amount of times in order to achieve a deposition of a desired amount of silicon oxide in the gap feature. Optionally, the step (720) of generating a nitrogen and argon plasma in the reaction chamber can be omitted during one or more cycles. Optionally, the nitrogen plasma can be omitted from step (720) during one or more of the cycles. Optionally, the argon plasma can be omitted from step (720) during one or more of the cycles. When a desired amount of silicon oxide has been deposited in the gap feature, the process is stopped (760).

Figure 8:
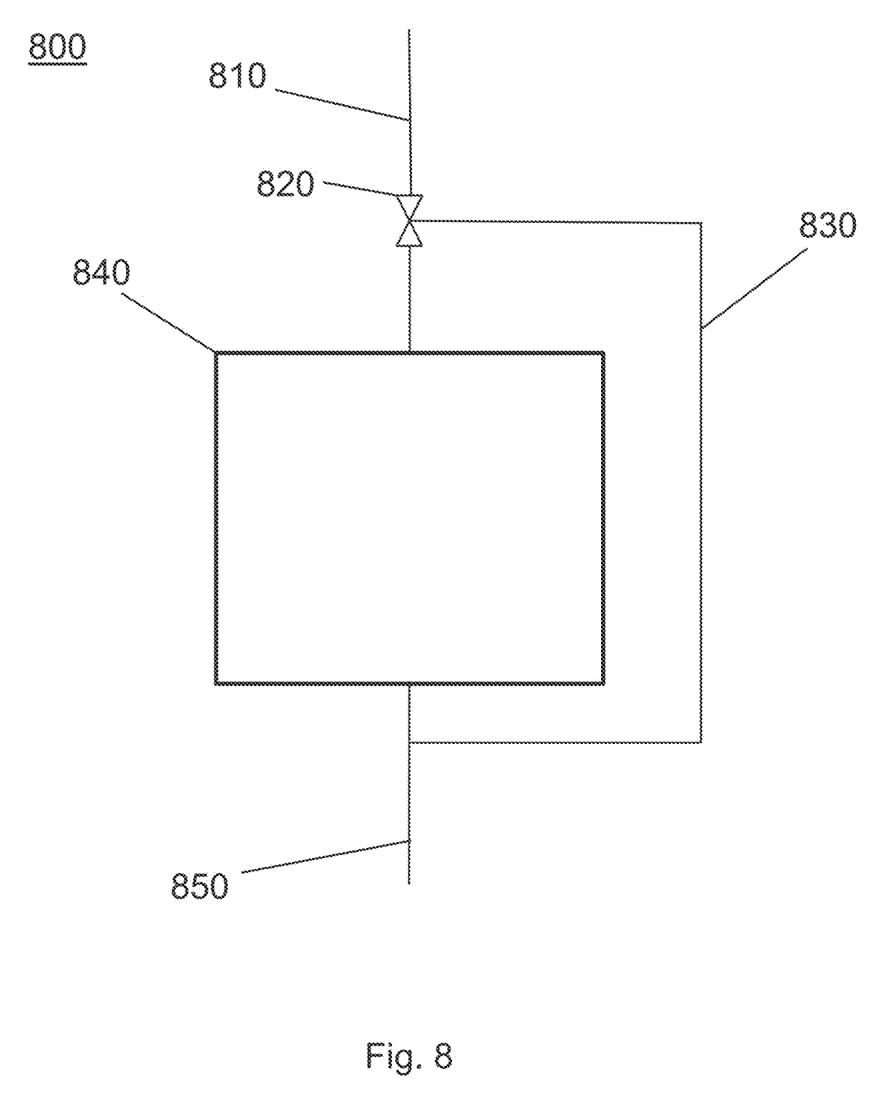
FIG. 8 schematically shows an embodiment of a system as described herein.

FIG. 8 shows selected components of an embodiment of a plasma-enhanced atomic layer deposition (PEALD) apparatus (800) that may be used for carrying out a method as described herein. The apparatus (800) comprises a gas line (810), a bypass valve (820), a bypass line (830), a reactor (840), and an exhaust line (850). Such an apparatus comprising a bypass valve (820) can suitably increase throughput of a method as described herein. In particular, the bypass valve (820) can be used to allow for continuous gas flow, even when a certain process gas is not needed in the reaction chamber. The use of a bypass valve (820) can thus allow avoiding the use of gas stabilization steps during the processing of multiple wafers and could make switching to a different gas composition for treatment steps easier, thus improving throughput.

Additionally, the bypass valve allows continuous flow of certain gasses, and may therefore reduce particle contamination as pressure pulses trough lines are avoided. Furthermore flows can be started in bypass mode and may therefore prevent initial particle bursts to the chamber at start up (first wafer effects, pre-recipe requirements etc.).

The gas line (810) can be a line carrying any of the gasses described herein, such as a precursor gas line, or a noble gas line, or a nitrogen gas line, or an oxygen gas line. Advantageously, the apparatus (800) comprises multiple gas lines, such as a precursor gas line, a noble gas line, a nitrogen gas line, and an oxygen gas line.

Thus, in some embodiments, a precursor is diverted through a precursor bypass duct during the step of subjecting the substrate to a plasma pre-treatment.

Additionally or alternatively, a plasma gas is diverted through a plasma gas bypass duct, during the step of selectively forming a material on the lower surface.

In some embodiments, the plasma gas used during the first plasma pre-treatment is diverted using a bypass valve during the step of selectively forming a material on the lower surface.

In some embodiments, the plasma gas used during the second plasma pre-treatment is diverted using a bypass valve during the step of selectively forming a material on the lower surface.

In some embodiments, the plasma gasses used during the first and second plasma pre-treatments are diverted using bypass valves during the step of selectively forming a material on the lower surface.

In some embodiments, a precursor is diverted using a bypass valve during at least one of the first and second plasma pre-treatment.

The example embodiments of the disclosure described herein do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

In the present disclosure, where conditions and/or structures are not specified, the skilled artisan in the art can readily provide such conditions and/or structures in view of the present disclosure, as a matter of routine experimentation.

What is claimed is:

1. A method for filling a gap feature on a substrate surface, the method comprising, in the given order:
   a step of positioning a substrate on a substrate support in a reaction chamber, the substrate comprising one or more gap features, the one or more gap features comprising an upper part comprising an upper surface and a lower part comprising a lower surface;
   a step of subjecting the substrate to a first plasma treatment and subjecting the substrate to a second plasma treatment, thereby inhibiting the upper surface while leaving the lower surface substantially unaffected; and,
   a step of selectively depositing a material on the lower surface,
   wherein selectively depositing a material on the lower surface comprises a cyclical process, the cyclical process comprising a plurality of sub cycles, a sub cycle comprising, in the following order:
      a step of exposing the substrate to an under-dosed halide-containing precursor, thereby forming a chemisorbed halide-containing precursor on the upper surface;
      a step of exposing the substrate to a second precursor, thereby forming a chemisorbed second precursor on the lower surface;
      a step of exposing the substrate to a nitrogen plasma comprising one or more reactive nitrogen species, thereby allowing the reactive nitrogen species to react with the chemisorbed halide-containing precursor to form a nitrogen and halogen containing etchant; and,
      a step of exposing the substrate to an oxygen plasma, thereby allowing one or more oxygen-containing reactive species comprised in the plasma to react with the chemisorbed precursor on the lower surface, thereby forming an oxide on the lower surface.

2. The method according to claim 1 wherein the first plasma treatment comprises generating a nitrogen-containing plasma in the reaction chamber.

3. The method according to claim 2 further comprising executing a plurality of super cycles, a super cycle comprising, in the following order:
   the step of subjecting the substrate to a first plasma treatment and subjecting the substrate to a second plasma treatment;
   the step of step of exposing the substrate to an under-dosed halide-containing precursor;
   the step of exposing the substrate to a second precursor;
   the step of exposing the substrate to a nitrogen plasma; and,
   the step of exposing the substrate to an oxygen plasma.

4. The method according to claim 1 wherein the second plasma treatment comprises generating a noble gas-containing plasma in the reaction chamber.

5. The method according to claim 1 wherein the first plasma treatment comprises generating a diatomic nitrogen-containing plasma in the reaction chamber.

6. The method according to claim 1 comprising executing a plurality of super cycles, a super cycle comprising
   the step of subjecting the substrate to a first plasma treatment and subjecting the substrate to a second plasma treatment; and,
   the step of selectively depositing a material on the lower surface.

7. The method according to claim 1 wherein the step of exposing the substrate to an oxygen plasma comprises generating a diatomic oxygen-containing plasma in the reaction chamber.

8. The method according to claim 1 wherein the halide-containing precursor comprises a halide-containing silicon precursor.

9. The method according to claim 8 wherein the halide-containing silicon precursor is selected from trimethoxy(3,3,3-trifluoropropyl)silane and nonafluorohexyl-trimethoxysilane.

10. The method according to claim 1, wherein the halide-containing silicon precursor comprises a halogenated alkoxysilane.

11. The method according to claim 1, wherein the second precursor is a second silicon precursor.

12. The method according to claim 11 wherein the second silicon precursor comprises an alkylaminosilane.

13. The method according to claim 11 wherein the second silicon precursor comprises an amino-substituted cyclosiloxane.

14. The method according to claim 11, wherein the second silicon precursor comprises Si, C, H, and N.

15. The method according to claim 11, wherein the second silicon precursor is selected from bisdiethylaminosilane and diisopropylaminosilane.

16. The method according to claim 1 wherein the material comprises silicon oxide.

17. The method according to claim 1 wherein, during at least one of the steps of subjecting the substrate to a first plasma treatment and subjecting the substrate to a second plasma treatment, the halide-containing precursor and/or the second precursor is diverted through a precursor bypass duct.

18. The method according to claim 1 wherein, during the step of selectively depositing a material on the lower surface, a plasma gas is diverted through a plasma gas bypass duct.

* * * * *